United States Patent [19]
Bartyzel et al.

[11] Patent Number: 5,600,259
[45] Date of Patent: Feb. 4, 1997

[54] METHOD AND APPARATUS FOR REDUCING INTERFERENCE IN A PIN ARRAY

[75] Inventors: Bernd Bartyzel; Steven A. Duncan; Daniel A. Fields; Keith A. Vanderlee, all of Austin, Tex.

[73] Assignee: International Business Machines Corporation, Armonk, N.Y.

[21] Appl. No.: 599,033

[22] Filed: Feb. 9, 1996

Related U.S. Application Data

[63] Continuation of Ser. No. 506,617, Jul. 21, 1995, abandoned, which is a continuation of Ser. No. 168,614, Dec. 17, 1993, abandoned.

[51] Int. Cl.$^6$ .................................................. G01R 31/02
[52] U.S. Cl. .............................................. 324/761; 324/758
[58] Field of Search .................................. 324/761, 754, 324/757, 758; 439/482

[56] References Cited

U.S. PATENT DOCUMENTS

| | | | |
|---|---|---|---|
| 4,230,985 | 10/1980 | Matrone et al. | 324/755 |
| 4,465,972 | 8/1984 | Sokolich. | |
| 4,508,405 | 4/1985 | Damon et al.. | |
| 4,535,536 | 8/1985 | Wyss. | |
| 4,609,243 | 9/1986 | Wyss. | |
| 4,707,655 | 11/1987 | Krüger | 439/482 |
| 4,799,007 | 1/1989 | Cook et al. | 324/758 |
| 4,803,424 | 2/1989 | Ierardi et al.. | |
| 4,857,009 | 8/1989 | Christensen. | |
| 4,870,353 | 9/1989 | Cook. | |
| 4,870,354 | 9/1989 | Davaut. | |
| 4,899,106 | 2/1990 | Ogura. | |
| 4,906,920 | 3/1990 | Huff et al.. | |
| 4,939,454 | 7/1990 | Miner. | |
| 4,980,637 | 12/1990 | Huff et al.. | |
| 5,077,598 | 12/1991 | Bartelink. | |
| 5,105,148 | 4/1992 | Lee | 439/482 |
| 5,136,238 | 8/1992 | Kade. | |

*Primary Examiner*—Ernest F. Karlsen
*Assistant Examiner*—Russell M. Kobert
*Attorney, Agent, or Firm*—Volel Emile; Andrew J. Dillon

[57] ABSTRACT

A multi-pin probe including a printed circuit board with multiple electrically conductive vias, multiple probes, each probe inserted into one of the electrically conductive vias, and a housing having multiple cavities inserted over the multiple probes, each cavity having a first and a second aperture around one of the probes, the first aperture being smaller than the second aperture. In addition, a method of manufacturing a multi-pin probe including the steps of manufacturing a printed circuit board with multiple electrically conductive vias, inserting multiple probes into the electrically conductive vias, and inserting a housing having multiple cavities over the multiple probes, each cavity having a first and a second aperture around one of the probes, the first aperture being smaller than the second aperture.

12 Claims, 5 Drawing Sheets

METHOD AND APPARATUS FOR REDUCING INTERFERENCE IN A PIN ARRAY

This is a continuation of application Ser. No. 08/506,617, filed Jul. 21, 1995, now abandoned, which is a continuation of application Ser. No. 08/168,614, filed Dec. 17, 1993, now abandoned.

DESCRIPTION

1. Technical Field

The present invention relates generally to electrical circuit testing and more particularly to multi-pin testing systems.

2. Background of the Invention

Newly manufactured printed circuit boards with or without components such as integrated circuit chips are generally tested prior to sale to the public. Typically, this testing includes making multiple electrical connections from a logic analyzer or other types of testing equipment to a large number of points on the printed circuit board and then testing for electrical shorts, lack of electrical continuity, and various logic tests using electrical signals through these electrical connections. A typical method for making these electrical connections to the printed circuit board is to use what is known in the art as a bed of nails which are connected by a cable or other means to the logic analyzer or other test equipment. A bed of nails is typically a matrix of contacts having spring loaded conductive probes called interposer pins arranged in rows and columns. The bed of nails is then placed to an appropriate location on the printed circuit board to make electrical contact, thereby electrically connecting the printed circuit board to the logic analyzer or other test equipment.

FIG. 1 is a cutaway diagram of one interposer pin out of many such pins inserted in a matrix formation into a carrier printed circuit board 10. Shown is a small portion of a carrier printed circuit board 10 having an aperture 15 drilled into an printed circuit board. The aperture was drilled into an area of the printed circuit board that has wiring to a remote location for connection to a logic analyzer or other testing devices. A socket 20 is soldered into the aperture 15, thereby making electrical contact to the wiring in the carrier printed circuit board and to the logic analyzer or other test equipment. Socket 20 has an indention 25 for holding an interposer pin 30. The indention 25 typically has a diameter smaller than that of the interposer pin. The interposer pin is pushed into socket 20 until the indention holds the interposer pin in place and makes a solid electrical connection to the interposer pin. The interposer pin includes a head 35, a cylindrical wall 36 and a spring 37. The head 35 moves up and down in the cylindrical wall 36 under tension from spring 37. This allows the interposer pin head to move up and down relative to other adjoining pin heads, thereby allowing testing of printed circuit boards that are not perfectly level.

With the increasing density of chips and other devices on printed circuit boards, the density of pins in a bed of nails or other multi-pin probes has increased dramatically. This increased density requires that the pins be more precisely placed within the carrier printed circuit board. In addition, electromagnetic interference between the various pins increases substantially when many pins are positioned closely together. Furthermore, various mechanisms and materials used for maintaining a precise placement of the pins may also increase electromagnetic interference between the pins due to the dielectric constant of the material holding the interposer pins.

U.S. Pat. No. 4,465,972 illustrates a housing with cylindrical holes for holding a bed of nails in a precise position. However, such a housing will have a dielectric constant that is less insulative than air, thereby increasing the possibility of introducing test errors.

One common technique for avoiding the use of a high density bed of nails is to manufacture printed circuit boards that have large areas for providing lower density pads or contacts to various points and/or devices on the printed circuit board. That is, an integrated circuit chip that is about 20 millimeters by 20 millimeters in size may require an area over 50 millimeters by 50 millimeters for providing low density electrical contacts to all the pins of the integrated circuit. With the need for more dense packaging of devices in modern computers and other electrical devices, this approach wastes a lot of "real estate" on the printed circuit boards.

DISCLOSURE OF THE INVENTION

The present invention includes a multi-pin probe including a printed circuit board with multiple electrically conductive vias, multiple probes, each probe inserted into one of the electrically conductive vias, and a housing having multiple cavities inserted over the multiple probes, each cavity having a first and a second aperture around one of the probes, the first aperture being smaller than the second aperture. In addition, the present invention includes a method of manufacturing a multi-pin probe including the steps of manufacturing a printed circuit board with multiple electrically conductive vias, inserting multiple probes into the electrically conductive vias, and inserting a housing having multiple cavities over the multiple probes, each cavity having a first and a second aperture around one of the probes, the first aperture being smaller than the second aperture.

A further understanding of the nature and advantages of the present invention may be realized by reference to the remaining portions of the specification and the drawings.

BEST MODE FOR CARRYING OUT THE INVENTION

Figure 1:
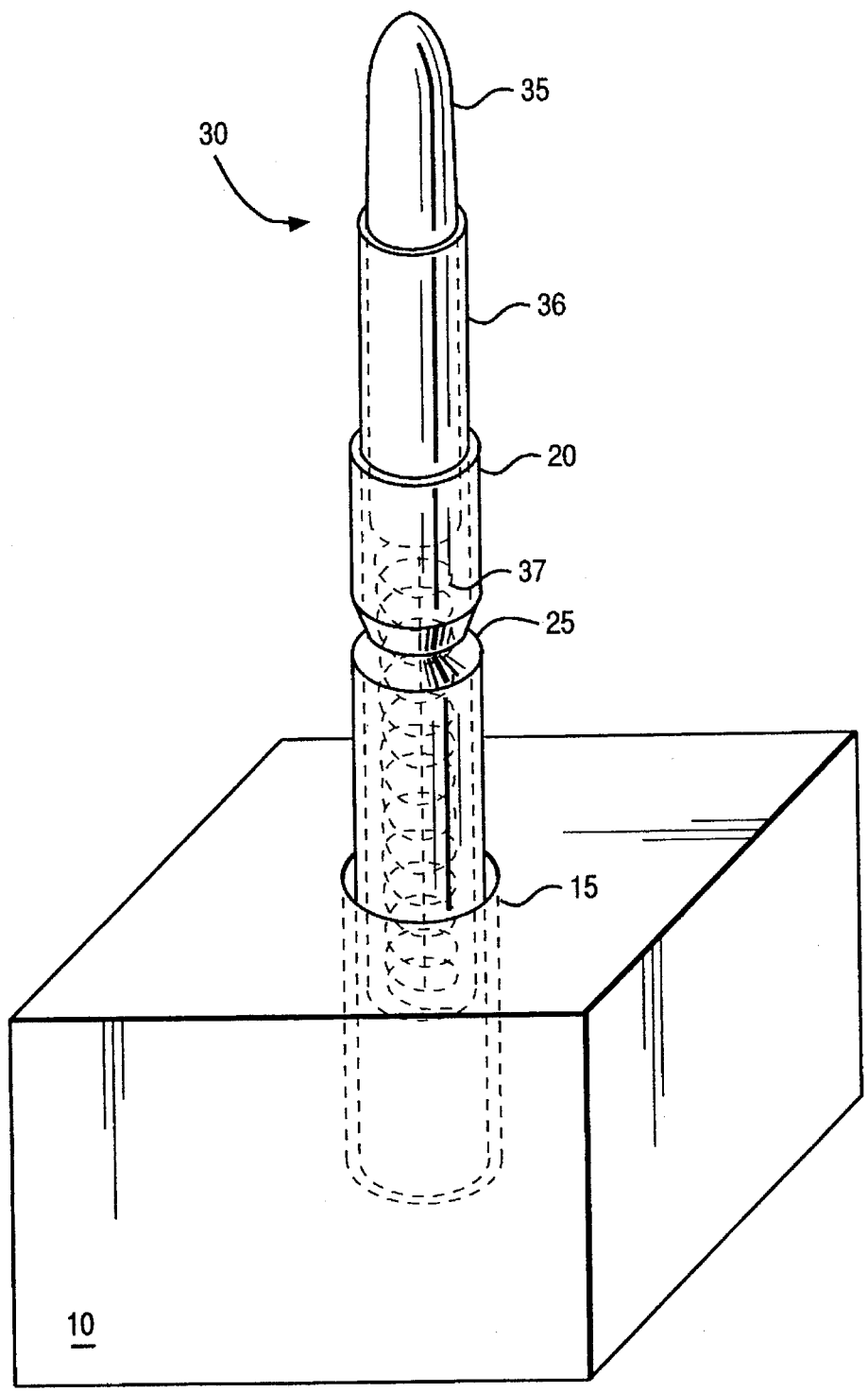
FIG. 1 is a cutaway diagram of one interposer pin out of many such pins inserted in a matrix formation into a carrier printed circuit board.
Figure 2:
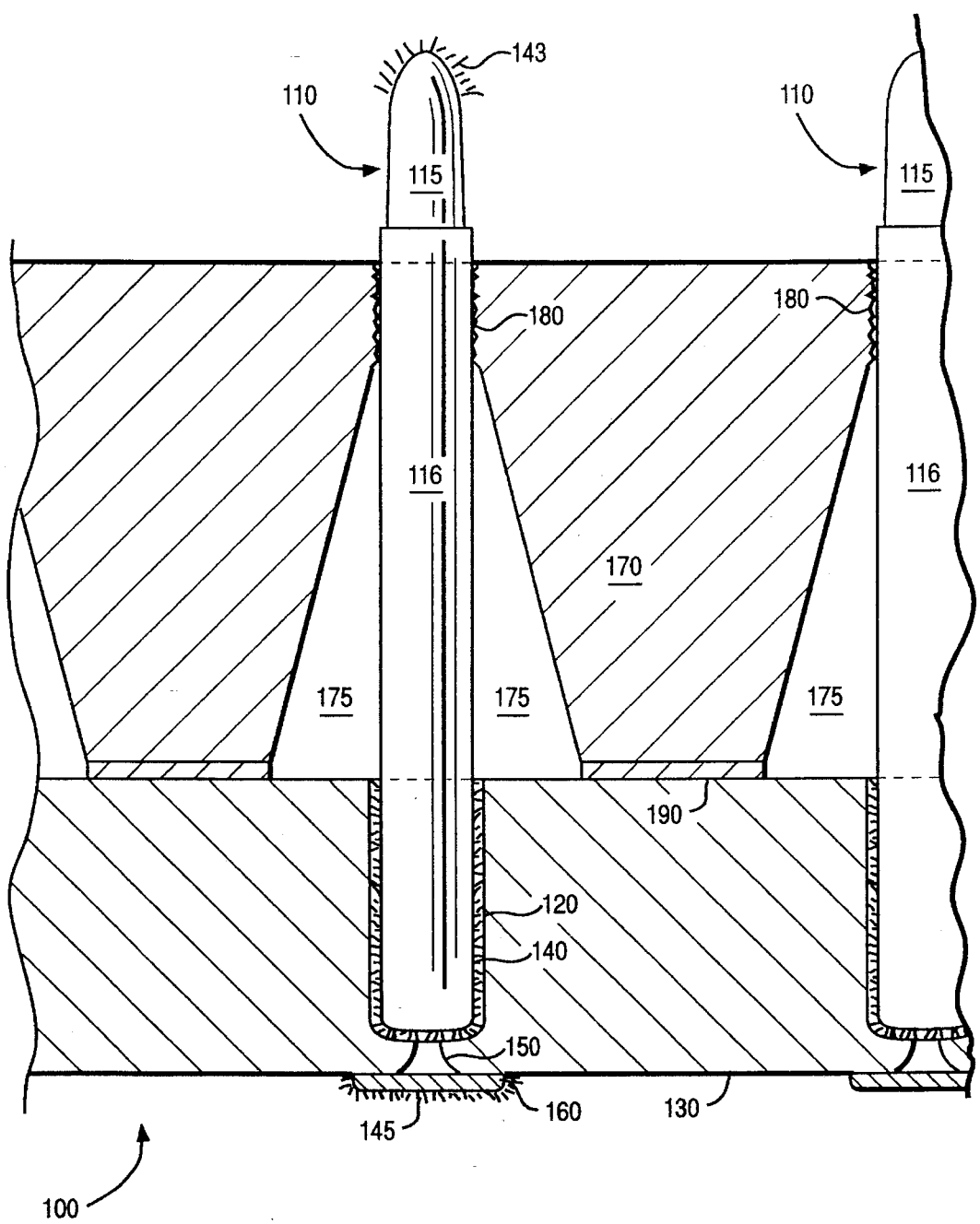
FIG. 2 is a cutaway diagram of a portion of a preferred multi-pin test probe.

FIG. 2 is a cutaway diagram of a portion of a preferred multi-pin test probe 100. An interposer pin 110 is shown having head 115 and cylindrical wall 116. The interposer pin also preferably includes a spring (not shown) within the cylindrical wall to provide tension to pin head 115. The interposer pin is shown inserted in a via 120 that was previously drilled to a selected depth into a printed circuit board 130 and coated with an electrically conductive metal. In the preferred embodiment, the interior of via 120 is also coated with many palladium dendrites 140. The palladium dendrites were selectively deposited in the via 120 in a process well known in the art. That is, the printed circuit board had been masked and placed in a bath of palladium solution which allowed the palladium to grow on unmasked metal surfaces. When the interposer pin is inserted into the via 120 having palladium dendrites 140, the palladium dendrites very effectively hold the interposer pin in place while providing an electrical connection to the metal lining of via 120. This electrical connection is more solid and provides less contact resistance due to the use of the dendrites. The palladium dendrites also allow the interposer pin to swivel somewhat during insertion of a carrier housing which will be described below. The via 120 metal lining and palladium dendrites 140 are electrically connected to a small metal lined via 150 which provides electrical connection to a pad 160. Palladium dendrites 143 may also be deposited on the tip of the pin head to provide a better electrical connection with less contact resistance to a device under test. In the preferred embodiment, the pad also has dendrites 145 on its external surface. The pads provides electrical connection from the interposer pins to external devices and the dendrites provide for a better connection with less contact resistance.

Once the interposer pins are inserted into the vias 120, a housing 170 is placed over the set of interposer pins to precisely position and hold the interposer pins in place. Housing 170 has a roughly conical cavity 175 around each interposer pin with a small aperture 180 near the head portion of the interposer pin. When the housing is slipped over the interposer pins, the large aperture first guides the interposer pins towards the small aperture and the small aperture provides a snug fit for the interposer pins in the desired position. The housing allows some movement as the interposer pins are moved through the small apertures to allow the interposer pin to be very snugly contained in the desired position by the housing. It is during this process of putting the housing over the interposer pins that the interposer pins may swivel somewhat as described above with reference to the dendrites.

In the preferred embodiment, the housing is preferably manufactured in a known stereolithography process out of a resin with a low dielectric constant. However, since the cavity surrounding the interposer pins contains air or a vacuum which has an extremely low dielectric constant, the dielectric constant of all materials between the pins is higher than if the cavity did not exist. That is, the conical cavity has the advantage of guiding the interposer pins to the correct position and providing a greater level of electromagnetic protection between the interposer pins. Housing 170 is then securely connected or fastened to printed circuit board 130 with a UV (ultraviolet) curable resin 190 that hardens when the resin is exposed to UV light.

Figure 3A:
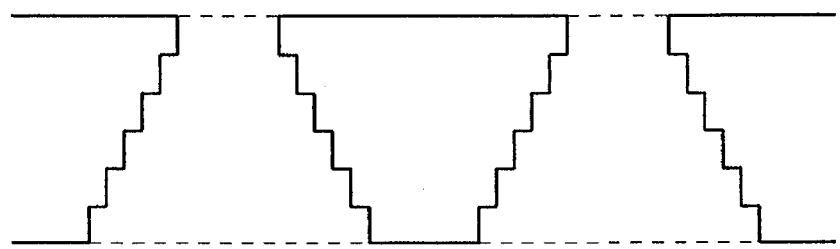
FIGS. 3A–3C illustrate various types of cavities that may be used in the carrier housing.
Figure 3B:
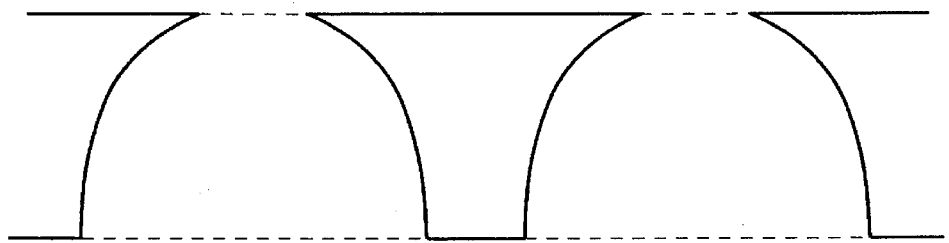
Figure 3C:
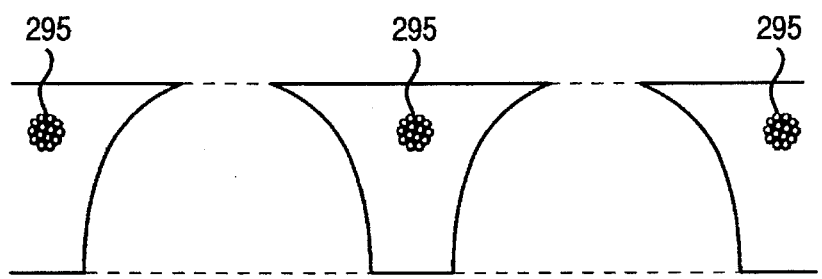

FIGS. 3A–3C illustrates various types of cavities that may be used in the carrier housing. FIG. 3A illustrates a roughly conical cavity that is manufactured out of a resin with a low dielectric constant using a stereolithography deposition or formation process such that the cavity has a stair-step edge. In the preferred embodiment, the larger aperture would be approximately 0.045 inches in diameter, the smaller aperture would be approximately 0.027 inches in diameter when using interposer pins approximately 0.030 inches in diameter located at approximately every 0.050 inches in a rectangular array. Please note, with reference to FIG. 2 above, that the narrow aperture is enlarged as the interposer pin is inserted in the housing. This provides for a snug fit of the interposer pin. FIG. 3B illustrates a parabolic cavity that also steers the interposer pin toward the narrow aperture. The parabolic cavity may have a larger cavity, thereby decreasing the overall dielectric constant of the housing between interposer pins. However, the parabolic cavity may be more difficult to manufacture and may possibly weaken the housing for a given density. FIG. 3C illustrates an alternative spherical cavity with ground wires 295 running between each cavity, thereby forming a set of Faraday cages. The ground wires provide additional reductions in electromagnetic interference between interposer pins. In other alternative embodiments, the interposer pin cylindrical wall may be an insulator for the interposer pin head and the housing may be coated with or made of an electrically conductive material connected to ground to further reduce electromagnetic interference between the interposer pins. In addition, the housing may be made of an electrically conductive material connected to ground with a coating of an insulator.

Figure 4:
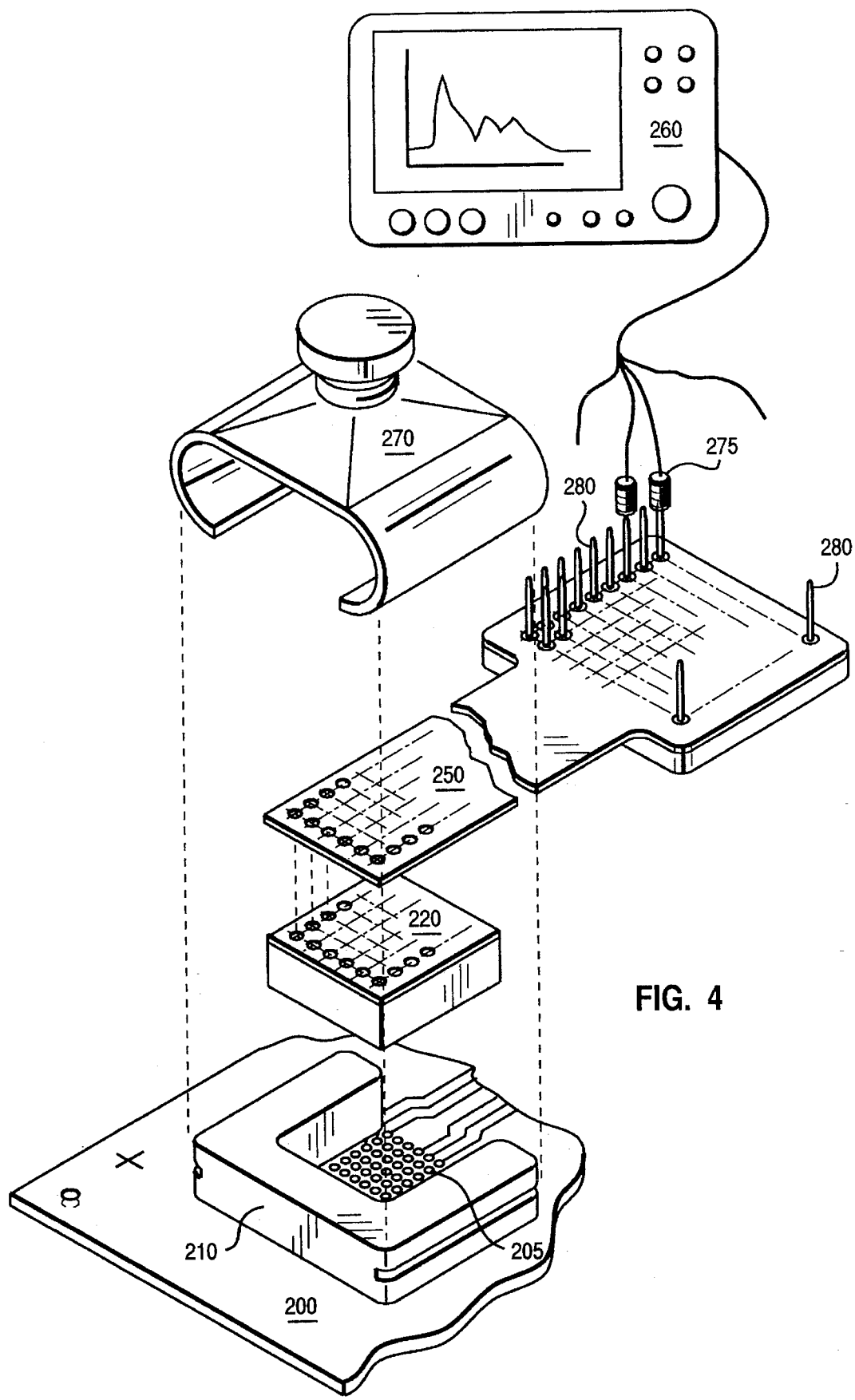
FIG. 4 is a perspective view of the multi-pin test probe with a printed circuit board under test and a logic analyzer.

FIG. 4 is a perspective view of the multi-pin test probe with a printed circuit board under test and a logic analyzer. The portion of the printed circuit board 200 shown in the present example is the back side of a solder ball connect integrated circuit (not shown) with a matrix of vias 205 which allow the multi-pin probe to connect to each pin of the integrated circuit. A three sided locator or anchor 210 has been attached to the printed circuit board to allow precise placement of test probe 220. As described with reference to FIG. 2, test probe 220 includes a carrier housing, interposer pins and a printed circuit board with contact pads assembled together. A flex cable 250 connected to logic analyzer 260 is also aligned by locator or anchor 210 as the flex cable is clamped onto the test probe with a clamp 270 in the preferred embodiment. The logic analyzer is coupled to the flex cable with a probe 275, commonly known as an octopus, to pins 280 on the flex cable. The flex cable has electrical contacts that match the contacts of the test probe. As described above, the multi-pin probe has palladium or other metal dendrites on the contact pads to provide a better electrical connection and thereby reduce contact resistance. In alternative embodiments, the probe printed circuit card may provide wiring from each interposer pin to vias over a large area such that the vias are arranged in a low density pattern. This would allow the use of a low density probe to the high density probe in a probe on probe arrangement to provide electrical connections to a logic analyzer or other test equipment. In addition, a flex cable or other types of device may be permanently connected from the test probe to the logic analyzer or other test devices.

Figure 5:
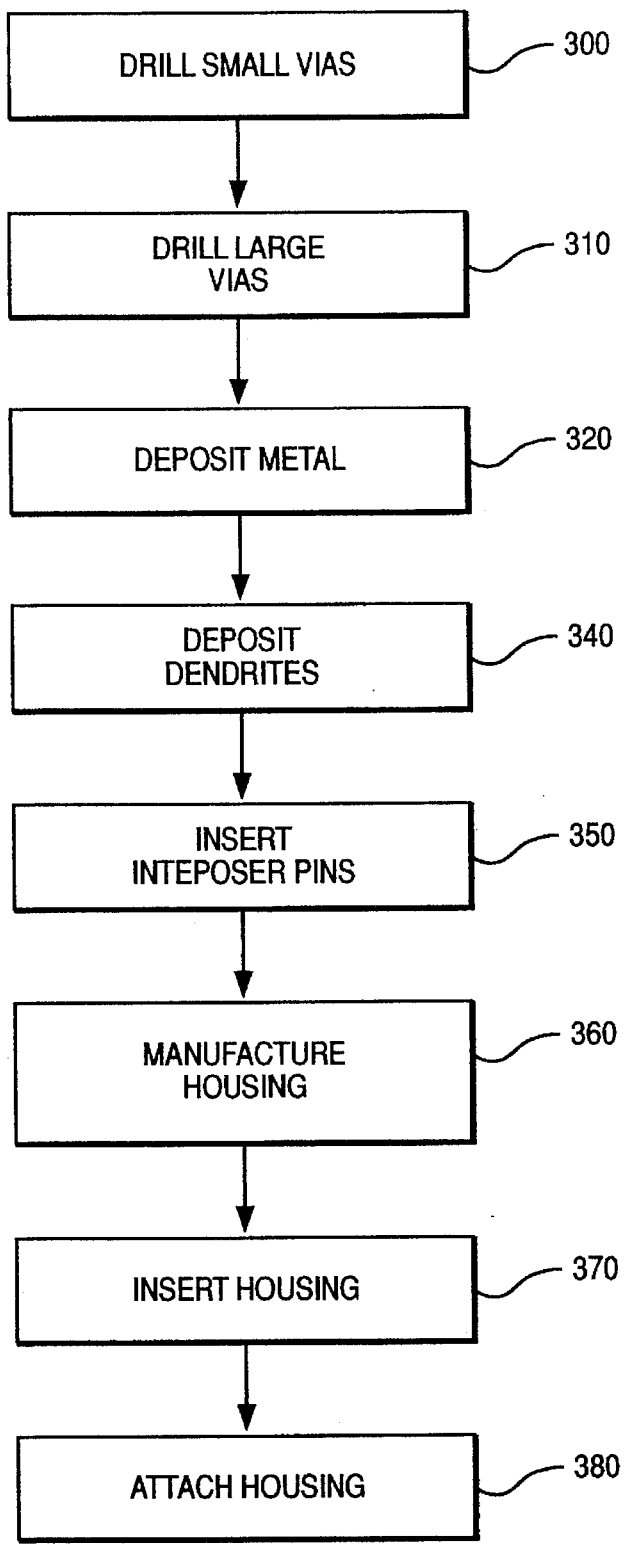
FIG. 5 is a flowchart of a method of manufacturing the preferred multi-pin test probe.

FIG. 5 is a flowchart of a method of manufacturing the preferred multi-pin test probe according to a preferred embodiment of the invention. In a first step 300, a printed circuit board is drilled with small vias in a desired arrangement and density corresponding to the desired arrangement and density of the interposer pins. In step 310, small cavities to receive the interposer pins are drilled into each small via to a selected depth on one side of the printed circuit board, thereby providing large vias. In step 320, the small and large vias are lined with an electrically conductive material connected to a metal pad on the side of the small vias, thereby providing an electrical connection from the large vias through the small vias to the metal pads. In an alternative embodiment, the small vias may be connected by wiring in the printed circuit board to low density contacts elsewhere on the printed circuit board. In step 340, the printed circuit board is selectively masked and dipped into a palladium solution bath to coat the interior of the large vias and the metal pads with palladium or other metal dendrites. Once the printed circuit board is cleaned, interposer pins are inserted into each large via in step 350. In step 360, a housing is manufactured to the desired shape using a stereolithography deposition process. In alternative embodiments, a housing may be manufactured using various types of materials with cavities of the desired shape and density by drilling, cutting (such as with a water jet), burning with a hot bed of nails, etc. In step 370, the housing is inserted onto the bed of interposer pins. Until the use of non-cylindrical cavities, this step was very difficult due to the difficulty of having all the interposer pins aligned directly with each hole through the housing. In step 380, the housing is then permanently connected to the printed circuit board by using a UV hardened glue and exposing the assembly to UV light when the housing is clamped to place. At this point, the multi-pin probe assembly may be used as described above or it may be more permanently attached to a flex cable or other conductive means for attachment to a logic analyzer or other test device.

Although the present invention has been fully described above with reference to specific embodiments, other alternative embodiments will be apparent to those of ordinary skill in the art. Therefore, the above description should not be taken as limiting the scope of the present invention which is defined by the appended claims.

What is claimed is:

1. A multi-pin probe comprising:
   a printed circuit board with a plurality of electrically conductive vias for making connection to a test system;
   a plurality of elongated probes, a first end of each probe partially inserted into one of said electrically conductive vias; a second end of each probe extending to make connection to a conductive area of an object under test; and
   a housing having a plurality of cavities inserted over said second end of said plurality of probes such that said second end of each probe extends completely through the housing whereby said connection to a conductive area may be made, each cavity having a first and a second aperture around one of said probes with the first aperture in constant contact with said probe to position said probe to make said connection to a conductive area and the second aperture not in contact with said probe, the first aperture being smaller than the second aperture with the second aperture being located on a side of the housing closest to the printed circuit board and spaced from said second end.

2. The multi-pin probe of claim 1 wherein each cavity is conical.

3. The multi-pin probe of claim 1 wherein the housing includes electrically conductive materials coupled to ground to reduce electromagnetic interference between the probes.

4. The multi-pin probe of claim 1 wherein said plurality of the electrically conductive vias have electrically conductive dendrites to receive interposer pins.

5. A device testing system comprising:
   a) a logic analyzer; and
   b) a multi-pin probe coupled to said logic analyzer including:
   (i) a printed circuit board with a plurality of electrically conductive vias for making connection to said logic analyzer;
   (ii) a plurality of elongated probes, a first end of each probe partially inserted into one of said electrically conductive vias; a second end of each probe extending to make connection to a conductive area of an object under test; and
   (iii) a housing having a plurality of cavities inserted over said second end of said plurality of probes such that said second end of each probe extends completely through the housing whereby said connection to a conductive area may be made, each cavity having a first and a second aperture around one of said probes with the first aperture in constant contact with said probe to position said probe to make said connection to a conductive area and the second aperture not in contact with said probe, the first aperture being smaller than the second aperture with the second aperture being located on a side of the housing closest to the printed circuit board and spaced from said second end.

6. The device testing system of claim 5 wherein each cavity is conical.

7. The device testing system of claim 5 wherein the housing includes electrically conductive materials coupled to ground to reduce electromagnetic interference between the probes.

8. The device testing system of claim 5 wherein said plurality of the electrically conductive vias have electrically conductive dendrites to receive interposer pins.

9. A method of manufacturing a multi-pin probe comprising the steps of:
   manufacturing a printed circuit board with a plurality of electrically conductive vias, the vias being adapted for connection to a test system;
   inserting a first end of a plurality of probes snugly fitting into said electrically conductive vias; and
   inserting a housing having a plurality of cavities over a second end of said plurality of probes such that each probe extends through the housing to a position for engaging a conductive area of an object under test, each cavity having a first and a second aperture around one of said probes with the first aperture in constant contact with said probe for holding second end of the probe in proper position to engage said conductive area, and the second aperture not in contact with said probe and spaced from the probe, the first aperture being smaller than the second aperture with the second aperture being located on a side of the housing closest to the printed circuit board and spaced from said second end.

10. The method of claim 9 wherein each cavity is conical.

11. The method of claim 9 wherein the housing includes electrically conductive materials coupled to ground to reduce electromagnetic interference between the probes.

12. The method of claim 9 wherein electrically conductive dendrites are deposited in said plurality of the electrically conductive vias to receive interposer pins.

* * * * *